United States Patent
Kobayashi et al.

(10) Patent No.: US 11,869,793 B2
(45) Date of Patent: Jan. 9, 2024

(54) ELECTROSTATIC CHUCK AND SUBSTRATE FIXING DEVICE

(71) Applicant: SHINKO ELECTRIC INDUSTRIES CO., LTD., Nagano (JP)

(72) Inventors: Hiroyuki Kobayashi, Nagano (JP); Akihiro Kuribayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 443 days.

(21) Appl. No.: 17/160,911

(22) Filed: Jan. 28, 2021

(65) Prior Publication Data
US 2021/0242065 A1 Aug. 5, 2021

(30) Foreign Application Priority Data
Jan. 31, 2020 (JP) ................................. 2020-014637

(51) Int. Cl.
*H01L 21/683* (2006.01)
*H01L 21/67* (2006.01)

(52) U.S. Cl.
CPC .... *H01L 21/6833* (2013.01); *H01L 21/67103* (2013.01)

(58) Field of Classification Search
CPC ........... H01L 21/6833; H01L 21/67103; H01L 21/68785; H01J 37/32724; B23Q 3/15; H02N 13/00; H05B 3/143; H05B 3/20; H05B 2203/035
See application file for complete search history.

(56) References Cited

U.S. PATENT DOCUMENTS

| 5,414,245 A | * | 5/1995 | Hackleman | B41J 2/164 219/548 |
| 10,690,414 B2 | * | 6/2020 | Gaff | H01L 21/68785 |
| 2013/0068750 A1 | | 3/2013 | Gaff et al. | |
| 2014/0154819 A1 | | 6/2014 | Gaff et al. | |
| 2018/0374763 A1 | | 12/2018 | Gaff et al. | |

FOREIGN PATENT DOCUMENTS

| JP | 2014-112672 A | 6/2014 |
| JP | 2016-213447 | 12/2016 |

OTHER PUBLICATIONS

Japanese Office Action dated Jul. 18, 2023 in corresponding Japanese application No. 2020-014637; English translation included (6 pages).

* cited by examiner

*Primary Examiner* — Jarrett J Stark
(74) *Attorney, Agent, or Firm* — Rankin, Hill & Clark LLP

(57) ABSTRACT

An electrostatic chuck is configured to adsorb and retain an object thereon. The electrostatic chuck includes: a base body on which the object is mounted; an electrostatic electrode that is provided in the base body; a plurality of heating elements that are provided in the base body; a plurality of current control elements that are provided in the base body, and each of which is connected in series with a corresponding one of the heating elements; and a control circuit that is provided in the base body, and that is connected to the current control elements and configured to control operations of the current control elements.

9 Claims, 9 Drawing Sheets

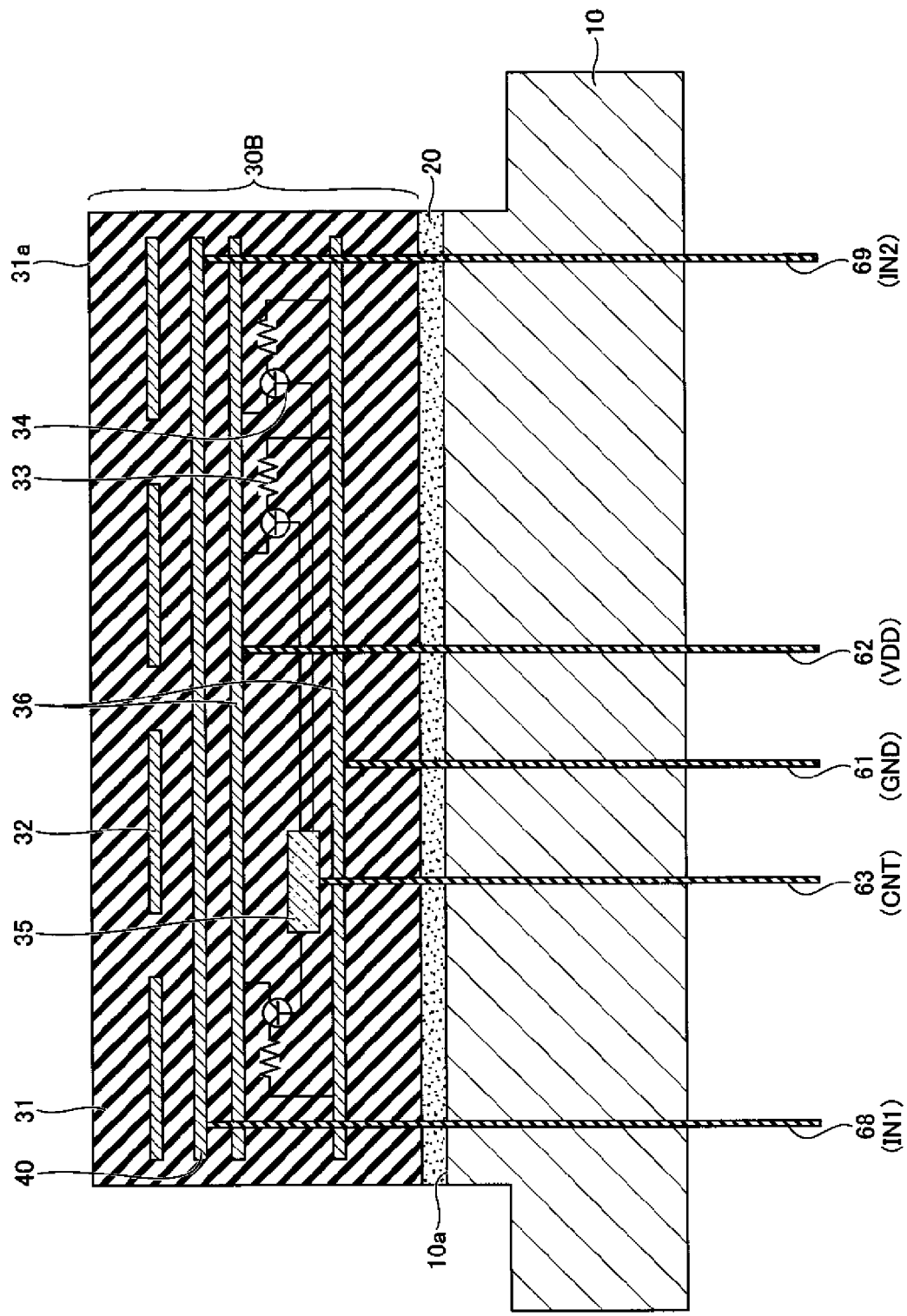

ELECTROSTATIC CHUCK AND SUBSTRATE FIXING DEVICE

This application claims priority from Japanese Patent Applications No. 2020-014637, filed on Jan. 31, 2020, the entire contents of which are herein incorporated by reference.

BACKGROUND

Technical Field

The present disclosure relates to an electrostatic chuck and a substrate fixing device.

Background Art

In the background art, a film forming apparatus or a plasma etching apparatus used in manufacturing a semiconductor device has a stage for accurately retaining a wafer thereon in a vacuum processing chamber. For example, a substrate fixing device that adsorbs and retains a wafer by an electrostatic chuck mounted on a base plate has been proposed as such a stage.

As an example of the substrate fixing device, there is a substrate fixing device having a structure in which heating elements for adjusting temperature of a wafer are provided. This substrate fixing device includes, for example, a plurality of independently controllable heater zones, and at least one diode is disposed as a heating element in each of the heater zones (e.g. see JP-A-2016-213447).

When the plurality of heating elements are built in the electrostatic chuck as in the aforementioned substrate fixing device, accuracy of adjustment of temperature in the surface of the electrostatic chuck can be improved as the number of the heating elements increases. However, in order to control the plurality of heating elements independently, a large number of electric wires for the control need to be led out to the outside of the electrostatic chuck. Further, the electric wires led out to the outside of the electrostatic chuck need to be led out to the outside via through holes formed in the base plate. Therefore, as the number of the electric wires increases, the number of the through holes also increases. That is, due to the increase in the number of the electric wires, an area occupied by the through holes in the base plate increases, and the degree of freedom for designing the base plate decreases.

SUMMARY

The present disclosure provides an electrostatic chuck that can suppress a decrease in the degree of freedom for designing a base plate even in a case where a plurality of heating elements are provided in the electrostatic chuck.

A certain embodiment provides an electrostatic chuck is configured to adsorb and retain an object thereon. The electrostatic chuck includes: a base body on which the object is mounted; an electrostatic electrode that is provided in the base body; a plurality of heating elements that are provided in the base body; a plurality of current control elements that are provided in the base body, and each of which is connected in series with a corresponding one of the heating elements; and a control circuit that is provided in the base body, and that is connected to the current control elements and configured to control operations of the current control elements.

BRIEF DESCRIPTION OF DRAWINGS

FIG. 9 is a schematic cross-sectional view illustrating a substrate fixing device according to a modification 2 of the first embodiment in a simplified manner.

DESCRIPTION OF EMBODIMENT

An embodiment of the disclosure will be described below with reference to the drawings. In each of the drawings, like constituent portions will be designated by like reference signs correspondingly and respectively, and duplicate description about these constituent portions may be omitted.

First Embodiment

Figure 1:
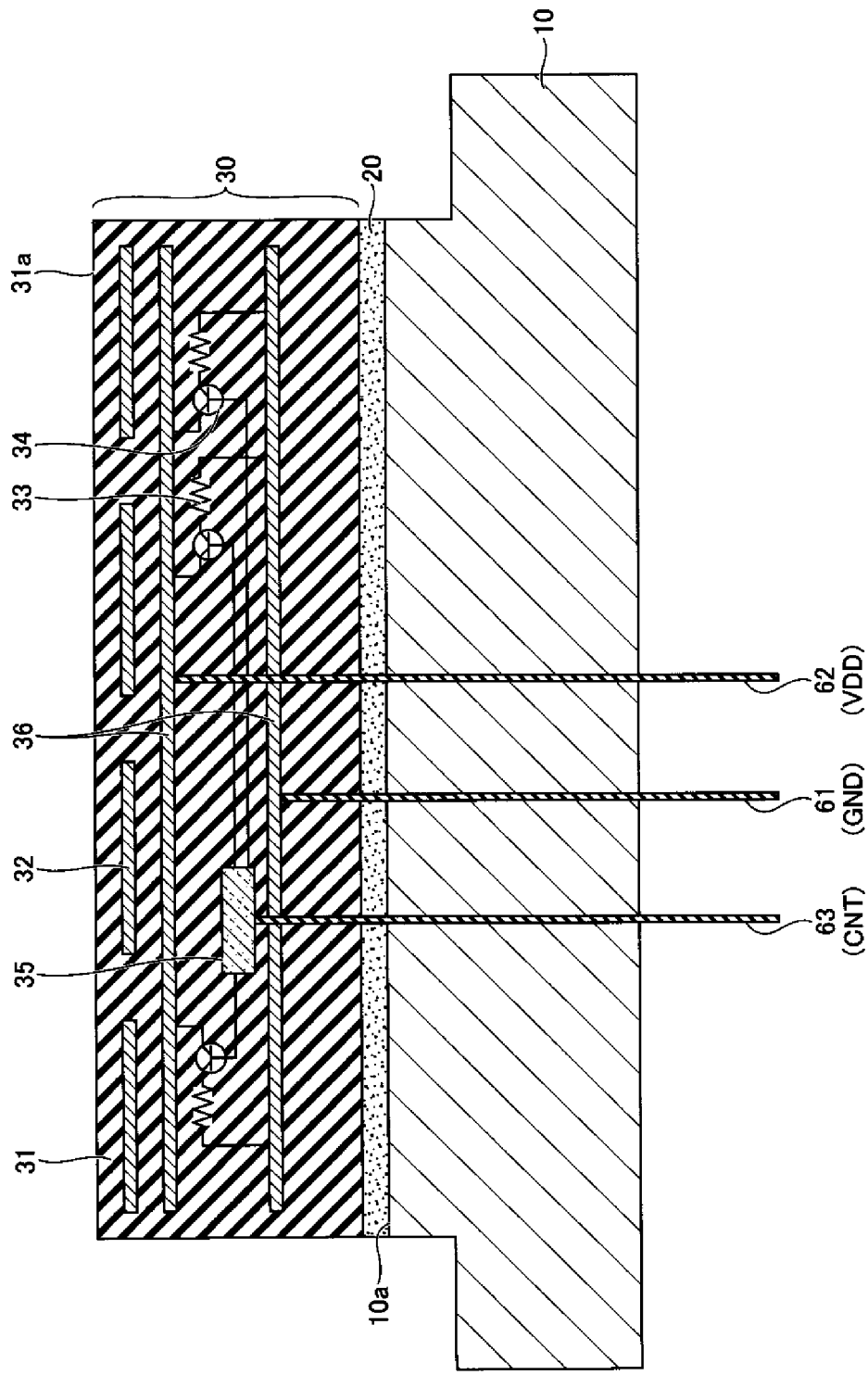
FIG. 1 is a schematic cross-sectional view illustrating a substrate fixing device according to a first embodiment in a simplified manner.

FIG. 1 is a schematic cross-sectional view illustrating a substrate fixing device according to a first embodiment in a simplified manner. With reference to FIG. 1, the substrate fixing device 1 has a base plate 10, an adhesive layer 20, and an electrostatic chuck 30 as main constituent elements. The substrate fixing device 1 is a device that adsorbs and retains a substrate (such as a wafer) which is an adsorption object, by the electrostatic chuck 30 mounted on one face of the base plate 10.

The base plate 10 is a member for mounting the electrostatic chuck 30 thereon. The base plate 10 is, for example, about 20 to 40 mm thick. The base plate 10 which is, for example, formed out of aluminum can be used as an electrode or the like for controlling plasma. By predetermined high frequency electric power supplied to the base plate 10, energy for making ions etc. in a plasma state collide against the substrate adsorbed on the electrostatic chuck 30 can be controlled so as to etch the substrate effectively.

A gas supply path into which inert gas for cooling the substrate adsorbed on the electrostatic chuck 30 is introduced may be provided inside the base plate 10. When, for example, the inert gas such as He or Ar is introduced into the gas supply path from the outside of the substrate fixing device 1 and supplied to a back face of the substrate adsorbed on the electrostatic chuck 30, the substrate can be cooled.

A refrigerant flow path may be provided inside the base plate 10. The refrigerant flow path is, for example, a hole that is formed annularly inside the base plate 10. For example, a refrigerant such as cooling water or Galden is introduced into the refrigerant flow path from the outside of the substrate fixing device 1. When the refrigerant is circulated in the refrigerant flow path to cool the base plate 10, the substrate adsorbed on the electrostatic chuck 30 can be cooled.

The electrostatic chuck 30 is a portion that adsorbs and retains the substrate which is the adsorption object. The planar shape of the electrostatic chuck 30 is, for example, a circle. The diameter of the substrate which is the object adsorbed by the electrostatic chuck 30 is, for example, 8, 12, or 18 inches.

Assume that a plan view denotes a view of an object from a normal direction of an upper face 10a of the base plate 10, and a planar shape denotes the shape of the object viewed from the normal direction of the upper face 10a of the base plate 10.

The electrostatic chuck 30 is provided on the upper face 10a of the base plate 10 through the adhesive layer 20. The adhesive layer 20 is, for example, a silicone-based adhesive agent. The adhesive layer 20 is, for example, about 0.1 to 2.0 mm thick. The adhesive layer 20 fixes the base plate 10 and the electrostatic chuck 30 to each other, and has an effect of reducing stress caused by a difference in coefficient of thermal expansion between the electrostatic chuck 30 made of ceramics and the base plate 10 made of aluminum.

The electrostatic chuck 30 has a base body 31, an electrostatic electrode 32, a plurality of heating elements 33, a plurality of current control elements 34, a control circuit 35, and wiring 36 as main constituent elements. An upper face of the base body 31 is a mounting face 31a on which the adsorption object is mounted. The electrostatic chuck 30 is, for example, a Johnsen-Rahbek type electrostatic chuck. However, the electrostatic chuck 30 may be a Coulomb force type electrostatic chuck alternatively.

The base body 31 is a dielectric. For example, ceramics such as aluminum oxide ($Al_2O_3$) or aluminum nitride (AlN) is used as the base body 31. The base body 31 may contain, as auxiliary agents, oxides of two or more elements that are, for example, selected from the group consisting of silicon (Si), magnesium (Mg), calcium (Ca), aluminum (Al), and yttrium (Y). The base body 31 is, for example, about 5 to 10 mm thick. In addition, a relative dielectric constant of the base body 31 at an AC voltage frequency of 1 kHz is, for example, about 9 to 10.

The electrostatic electrode 32 which is, for example, a thin film electrode is built in the base body 31. When the electrostatic electrode 32 is connected to a power supply provided outside the substrate fixing device 1 and a predetermined voltage is applied to the electrostatic electrode 32 from the power supply, adsorptive force is generated between the electrostatic electrode 32 and the wafer due to static electricity. Thus, the wafer can be adsorbed and retained on the mounting face 31a of the base body 31 of the electrostatic chuck 30. As the voltage applied to the electrostatic electrode 32 is higher, the adsorptive retention force is stronger. The electrostatic electrode 32 may have a unipolar shape or a bipolar shape. For example, tungsten, molybdenum, or the like is used as the material of the electrostatic electrode 32.

Figure 2:
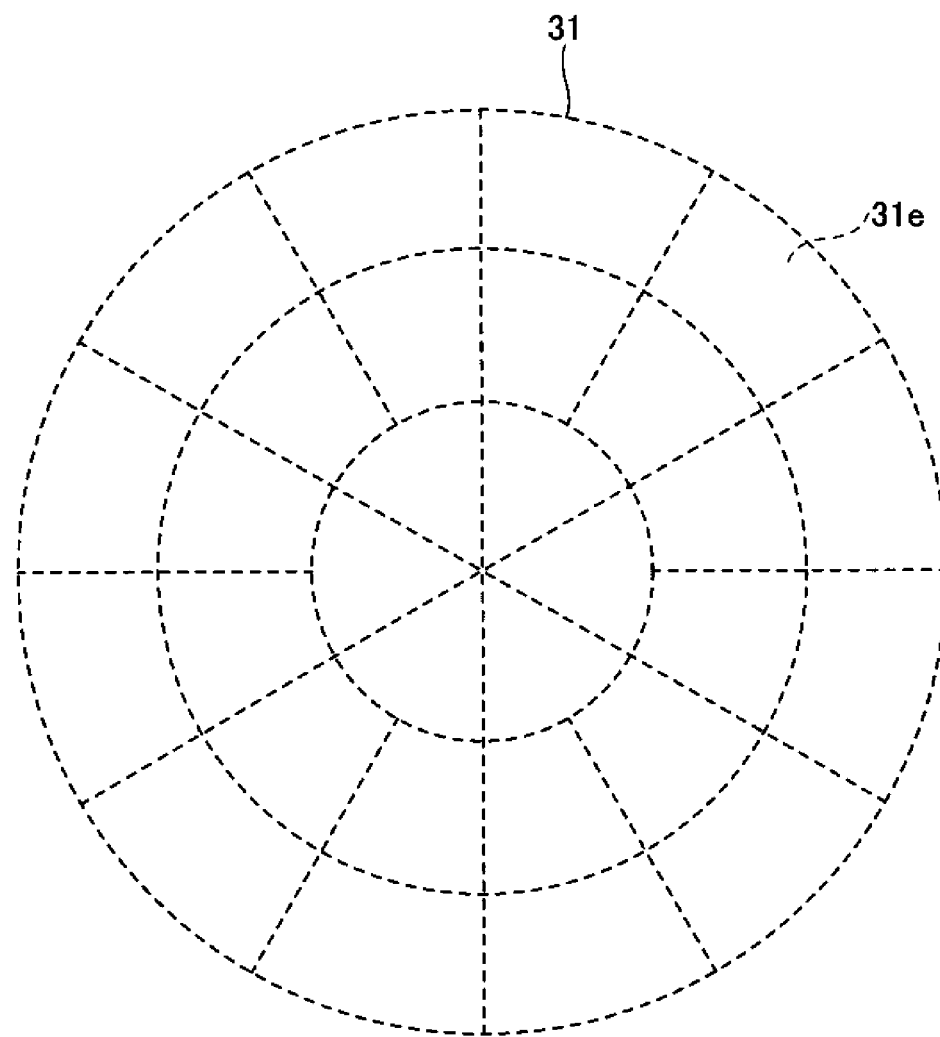
FIG. 2 is a plan view illustrating temperature-controllable regions defined in a base body.

FIG. 2 is a plan view illustrating temperature-controllable regions defined in the base body. As shown in FIG. 2, the plurality of temperature-controllable regions 31e whose temperatures can be independently controlled are defined in the base body 31 in the plan view. In the example of FIG. 2, thirty temperature-controllable regions 31e are defined. However, the number of the temperature-controllable regions 31e may be set in a range of about 100 to 200 alternatively. Further, each of the temperature-controllable regions 31e can have any planar shape. The temperature-controllable region 31 does not necessarily have to be substantially divided into a concentric shape but may be, for example, substantially divided into a grid shape.

Figure 3:
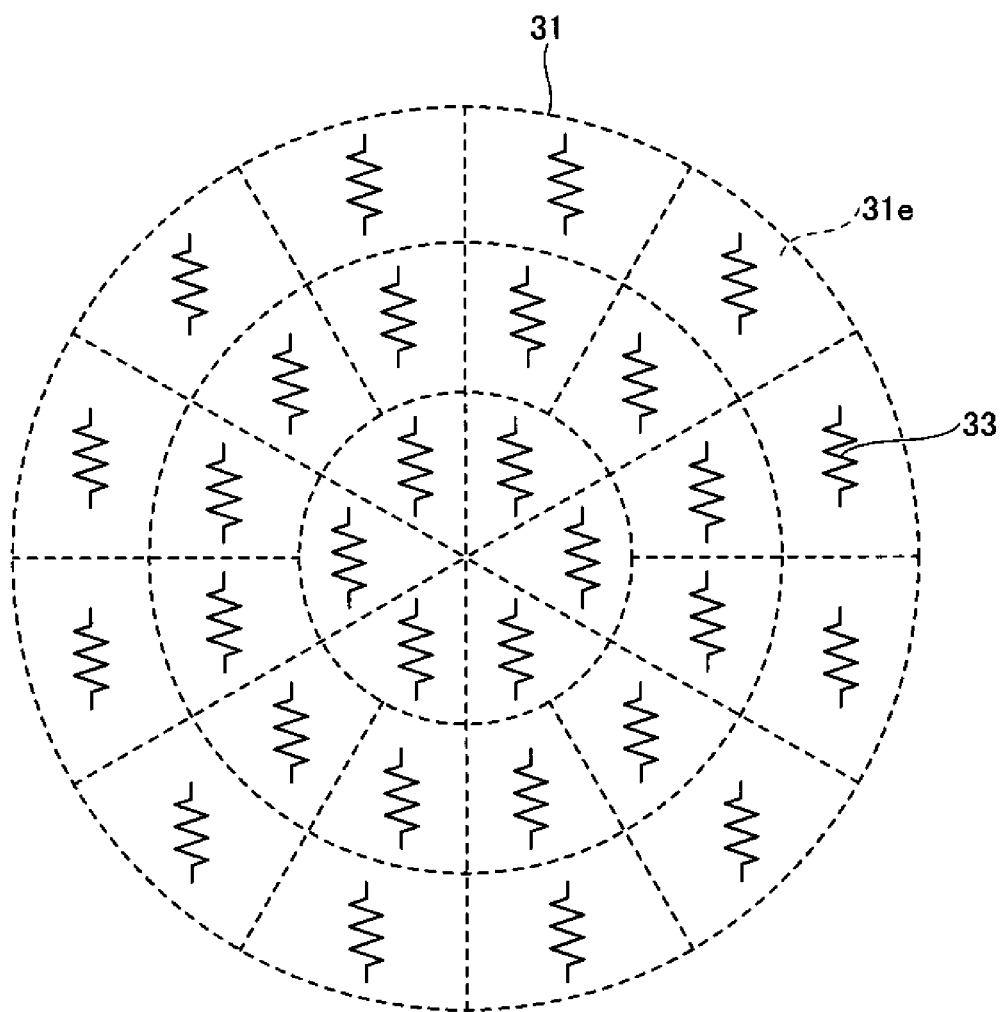
FIG. 3 is a plan view schematically showing heating elements disposed in the temperature-controllable regions respectively.

FIG. 3 is a plan view schematically showing the heating elements disposed in the temperature-controllable regions respectively. The heating elements 33 are heaters that are built in the base body 31, and that generate heat to heat the mounting face 31a of the base body 31 to a predetermined temperature when a current flows into the heaters.

As shown in FIG. 3, one heating element 33 is disposed in each of the temperature-controllable regions 31e. The heating elements 33 disposed in the temperature-controllable regions 31e respectively are insulated from one another. By changing the value of the current flowing into each of the heating elements 33, an amount of heat generated by the heating element 33 can be changed independently. In this manner, the plurality of temperature-controllable regions 31e whose temperatures can be controlled independently are defined in the base body 31 and the heating elements 33 are disposed in the temperature-controllable regions 31e respectively. With this arrangement, the mounting face 31a of the base body 31 can be heated uniformly.

The heating elements 33 can, for example, heat the temperature of the mounting face 31a of the base body 31 to about 50° C. to 200° C. For example, tungsten (W), copper (Cu), nickel (Ni), constantan (Cu/Ni/Mn/Fe alloy), or the like can be used as the material of the heating elements 33. Each of the heating elements 33 is, for example, about 20 to 100 μm thick. The heating element 33 can be, for example, formed into a predetermined pattern such as a zigzag pattern.

Figure 4:
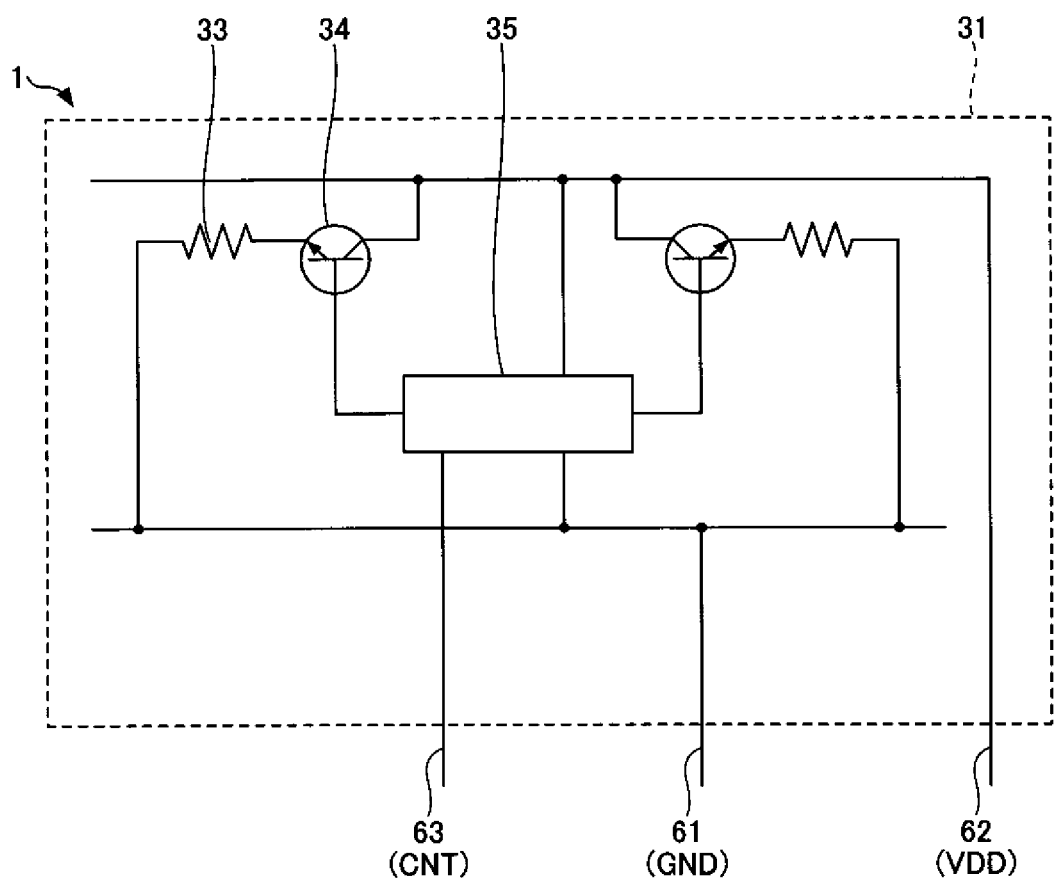
FIG. 4 is a diagram illustrating electrical connection among heating elements, current control elements, and a control circuit in the substrate fixing device according to the first embodiment.

FIG. 4 is a diagram illustrating electrical connection among heating elements, current control elements, and a control circuit in the substrate fixing device according to the first embodiment. As shown in FIG. 4, the current control elements 34 are built in the base body 31, and one heating element 33 is connected in series with one current control element 34. Each of the current control elements 34 is an element that controls a current flowing into the heating element 33 based on a control signal from the control circuit 35. The current control element 34 is, for example, a bipolar transistor. Alternatively, the current control element 34 may be a field effect transistor or the like. The size of the current control element 34 is, for example, about 3 mm in length×3 mm in width×1 mm in height.

In the example of FIG. 4, the current control element 34 is the bipolar transistor. The current control element 34 has a first terminal (emitter) electrically connected to one end of the heating element 33, and the other end of the heating element 33 is electrically connected to the GND. The current control element 34 has a second terminal (collector) electrically connected to a VDD (power supply), and a third terminal (base) electrically connected to a control terminal of the control circuit 35.

It is preferable that a highly heat-resistant transistor is used as the current control element 34. Examples of materials of such a transistor include gallium nitride (GaN), gallium oxide ($Ga_2O_3$), silicon carbide (SiC), etc. In the present application, a transistor having a junction temperature of 100° C. or higher is called the highly heat-resistant transistor. Here, the junction temperature is a maximum temperature at which the transistor can operate. A transistor made of any of the aforementioned materials is the highly heat-resistant transistor. By using the highly heat-resistant transistors as the current control elements 34, the temperature of the mounting face 31a of the base body 31 can be heated to 100° C. or higher.

The control circuit 35 is a semiconductor integrated circuit that is built in the base body 31 to control the current control elements 34. The control circuit 35 has a function of receiving a control signal indicating a command for an electric power level of each of the heating elements 33 from the outside of the substrate fixing device 1, and transmitting an output command corresponding to the heating element 33 to a corresponding one of the current control elements 34. The current control element 34 having received the output command from the control circuit 35 is electrically conducted. Due to a predetermined current flowing into the heating element 33 connected in series with the electrically conducted current control element 34, the heating element 33 generates heat.

The control circuit 35 may be, for example, provided with a microcomputer including a processor and a memory, and an electronic circuit including an active element and a passive element.

An electric wire 61 that is connected to the ground GND is led out to the outside of the substrate fixing device 1. An electric wire 62 that is connected to the power source VDD is led out to the outside of the substrate fixing device 1. An electric wire 63 through which a control signal can be inputted from the outside of the substrate fixing device 1 to the control circuit 35 is led out to the outside of the substrate fixing device 1. The number of such electric wires 63 may be arbitrary. When, for example, I²C (serial bus developed by NXP Semiconductors N.V) is used, the number of the electric wires 63 is two.

A socket may be provided on the base plate 10 in place of the form in which the electric wire 61, the electric wire 62 and the electric wire 63 are directly led out to the outside of the substrate fixing device 1. In this case, the electric wire 61, the electric wire 62 and the electric wire 63 may take a form in which the electric wires 61, 62 and 63 can be connected to the outside of the substrate fixing device 1 through the socket.

When a control signal is inputted from the outside of the substrate fixing device 1 through the electric wire 63, a voltage is outputted from the predetermined control terminal of the control circuit 35 to the third terminal (base) of the predetermined current control element 34. Thus, the current control element 34 is electrically conducted so that a current can flow into the heating element 33 connected to the current control element 34. An amount of heat generated by the heating element 33 can be changed by the value of the voltage outputted from the control terminal of the control circuit 35 to the current control element 34. Alternatively, a constant voltage (pulsed voltage) may be supplied from the control terminal of the control circuit 35 to the current control element 34 to activate the current control element 34 as a switch. In this case, the amount of heat generated by the heating element 33 can be changed by changing a time during which the voltage is supplied to the current control element 34.

Although two series circuits of the heating elements 33 and the current control elements 34 are illustrated in FIG. 4, the series circuits of the heating elements 33 and the current control elements 34 are provided as many as the number of the temperature-controllable regions 31e. When, for example, there are one hundred temperature-controllable regions 31e, one hundred series circuits of the heating elements 33 and the current control elements 34 are provided.

Figure 5:
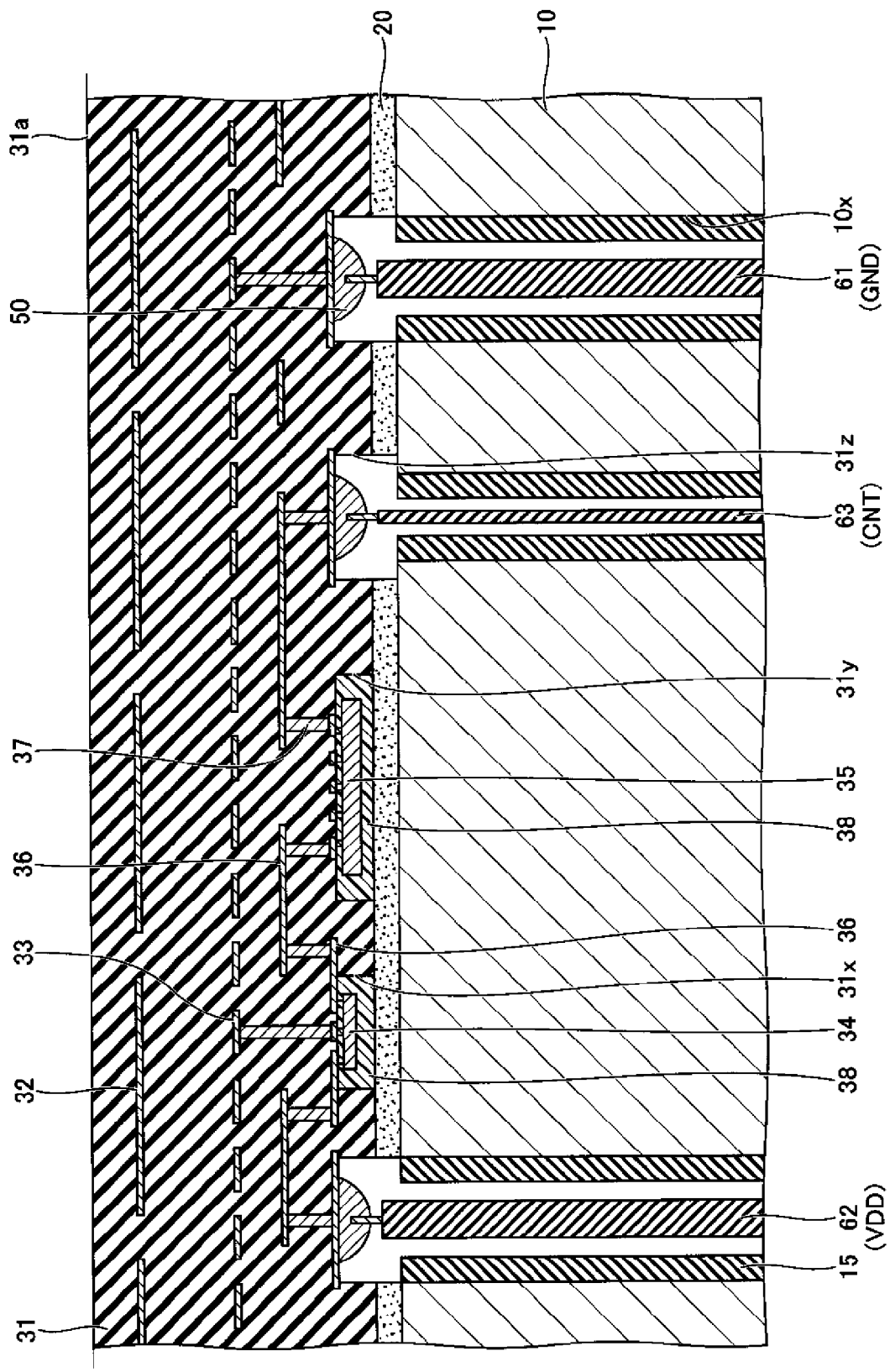
FIG. 5 is a partial cross-sectional view illustrating a mounting structure of a peripheral portion of a current control element and a control circuit.
Figure 6:
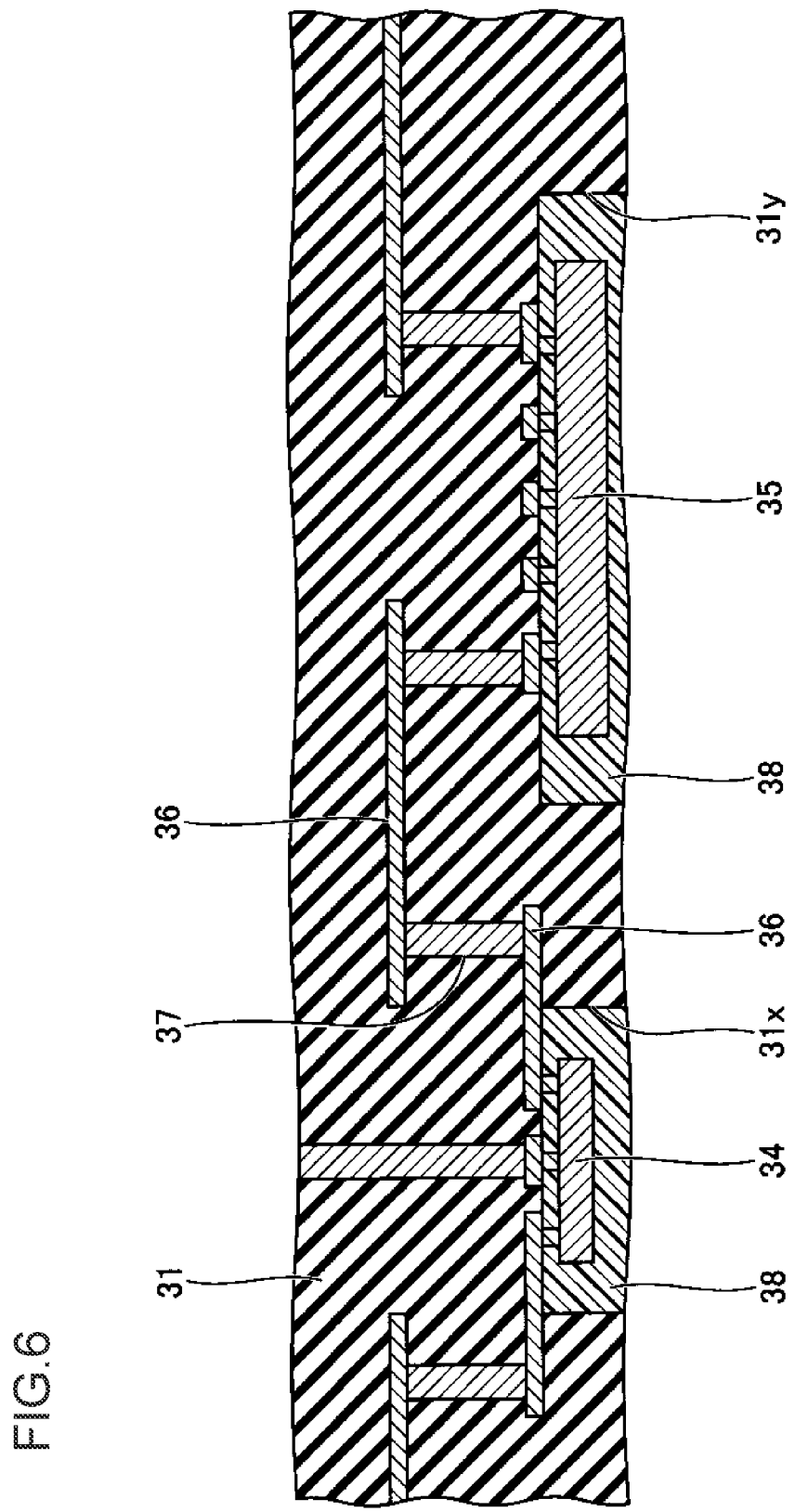
FIG. 6 is a partially enlarged cross-sectional view in which the peripheral portion of the current control element and the control circuit in FIG. 5 is enlarged.

FIG. 5 is a partial cross-sectional view illustrating a mounting structure of a peripheral portion of a current control element and a control circuit. FIG. 6 is a partially enlarged cross-sectional view in which the peripheral portion of the current control element and the control circuit in FIG. 5 is enlarged. With reference to FIG. 5 and FIG. 6, recesses 31x, 31y, and 31z opened to the side of the adhesive layer 20 are formed in a lower face of the base body 31.

The recess 31x is a recess for disposing the current control element 34 therein. Such recesses 31x can be provided as many as the number of the current control elements 34. However, a plurality of current control elements 34 may be disposed in one recess 31x alternatively. The recess 31y is a recess for disposing the control circuit 35 therein. Each of the recesses 31z is a recess in which a solder 50 for connecting an electric wire to the electrostatic chuck 30 is disposed.

Wiring 36 is built in the base body 31. The wiring 36 includes a current control element mounting pad, a control circuit mounting pad, solder connection pads, a wiring pattern, etc. The wiring 36 is formed in layers. Predetermined portions of the wiring 36 positioned in the different layers are connected to each other by via wirings 37. In addition, a predetermined portion of the wiring 36 is electrically connected to a predetermined portion of the heating element 33 by a via wiring 37. For example, tungsten (W), molybdenum (Mo), or the like can be used as the material of the wiring 36 and the via wirings 37.

The current control element mounting pad of the wiring 36 is exposed inside the recess 31x. The current control element 34 disposed inside the recess 31x is, for example, flip-chip mounted on the current control element mounting pad of the wiring 36. The current control element 34 disposed inside the recess 31x is sealed with a resin 38 that fills the recess 31x.

The control circuit mounting pad of the wiring 36 is exposed inside the recess 31y. The control circuit 35 disposed inside the recess 31y is, for example, flip-chip mounted on the control circuit mounting pad of the wiring 36. The control circuit 35 disposed inside the recess 31y is sealed with a resin 38 that fills the recess 31y. The resin 38 is, for example, an epoxy-based resin.

The solder connection pads of the wiring 36 are exposed in the recesses 31z respectively. Through holes 10x each for letting an electric wire therethrough are formed in the base plate 10 and the adhesive layer 20 so as to communicate with the recesses 31z respectively. The GND electric wire 61 disposed inside one of the through holes 10x is electrically connected to one of the solder connection pads by a solder 50. The power supply VDD electric wire 62 disposed inside another of the through holes 10x is electrically connected to another of the solder connection pads by a solder 50. The control signal CNT electric wire 63 disposed in the remaining through hole 10x is electrically connected to the remaining solder connection pad by a solder 50. In this manner, the electric wire 61 and the electric wire 62 are a pair of power supply lines connected to opposite ends of the series circuit of the heating element 33 and the current control element 34, and the electric wire 63 is a signal line connected to the control circuit 35.

Each of the electric wires 61 to 63 has, for example, a structure in which a conductor is clad with an insulator. The conductors of the electric wires 61 to 63 are electrically connected to the solder connection pads by the solders 50 respectively. In order to enhance insulating properties between the electric wires 61 to 63 and the base plate 10, it is preferable that insulating layers 15 are provided on inner walls of the through holes 10x respectively. For example, resin, ceramic, or the like, can be used as the insulating layers 15.

While a relatively large current flows into the GND electric wire 61 and the power supply VDD electric wire 62, only a very small current flows into the control signal CNT electric wire 63. Therefore, the diameter of the through hole 10x in which each of the electric wires 61 and 62 is disposed is larger than the diameter of the through hole 10x in which the electric wire 63 is disposed. Further, each of the diameters of the electric wires 61 and 62 is larger than the diameter of the electric wire 63. The diameter of the through hole 10x in which the electric wire 61, 62 is disposed is, for example, 5 mm, and the diameter of the through hole 10x in which the electric wire 63 is disposed is, for example, 2 mm. The diameter of the electric wire 61, 62 is, for example, 4 mm, and the diameter of the electric wire 63 is, for example, 01 mm. Since the electric wire 63 is relatively thin, a plurality of electric wires 63 may be disposed in one through hole 10x alternatively.

A method for manufacturing such a substrate fixing device 1 will be described here. In order to manufacture the substrate fixing device 1, first, an electrostatic chuck 30 in which an electrostatic electrode 32, heating elements 33, and wiring 36 are built in a base body 31 is manufactured by a well-known manufacturing method including a step of processing vias in a green sheet, a step of filling the vias with an electrically conductive paste, a step of forming a pattern to serve as the electrostatic electrode, a step of forming patterns to serve as the heating elements, a step of forming a pattern to serve as the wiring, a step of laminating and baking another green sheet, a step of flattening the surface, etc.

Then, a required number of recesses 31x that are hollow from a lower face of the base body 31 toward a mounting face 31a of the base body 31 are formed to expose current control element mounting pads of the wiring 36. Further, a required number of recesses 31y that are hollow from the lower face of the base body 31 toward the mounting face 31a of the base body 31 are formed to expose control circuit mounting pads of the wiring 36. Further, a required number of recesses 31z that are hollow from the lower face of the base body 31 toward the mounting face 31a of the base body 31 are formed to expose solder connection pads of the wiring 36. The recesses 31x, 31y, and 31z are formed, for example, by a method of laminating a perforated green sheet on the lowermost face.

Next, current control elements 34 are mounted on the current control element mounting pads of the wiring 36 exposed inside the recesses 31x, for example, by flip-chip mounting. Further, control circuits 35 are mounted on the control circuit mounting pads of the wiring 36 exposed inside the recesses 31y, for example, by flip-chip mounting. Then, uncured resins 38 are put into the recesses 31x to cover the current control elements 34, and then cured. Further, uncured resins 38 are put into the recesses 31y to cover the control circuits 35, and then cured.

Next, conductor portions of electric wires are connected to the solder connection pads inside the recess 31z through solders 50. Then, an uncured adhesive layer 20 is formed on the lower face of the electrostatic chuck 30 except for the portions where the recesses 31z are formed. Further, a base plate 10 in which through holes 10x for letting the electric wires therethrough, a refrigerant flow path, a gas supply path, and the like are formed is prepared. Then, the electric wires are let through the through holes 10x. Then, the base plate 10 is connected to the lower face of the electrostatic chuck 30 through the adhesive layer 20, and the adhesive layer 20 is cured. By the aforementioned steps, the substrate fixing device 1 shown in FIG. 1 etc. is completed.

An effect obtained by the electrostatic chuck 30 constituting the substrate fixing device 1 will be described here while a comparative example is given.

Figure 7:
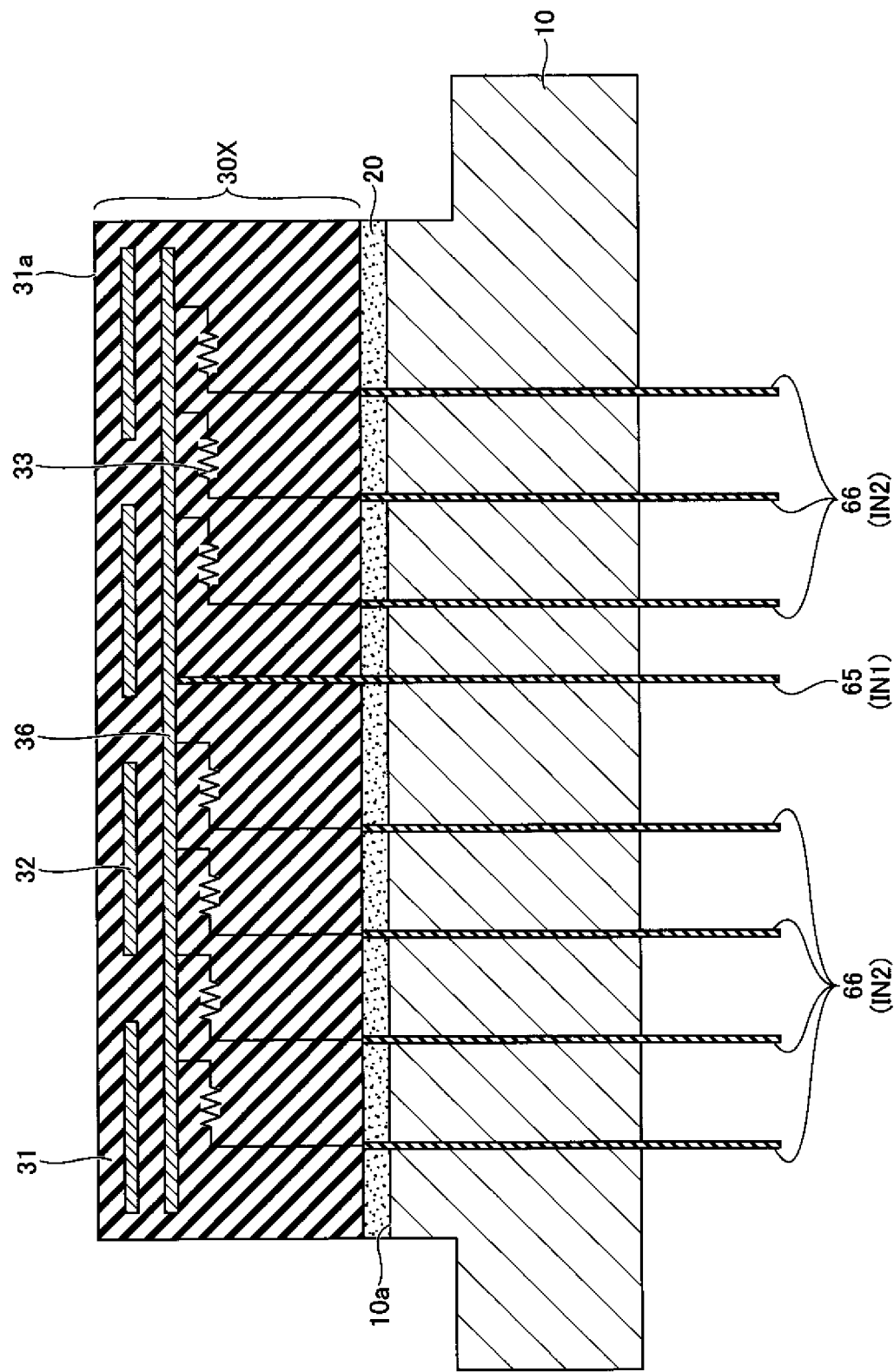
FIG. 7 is a schematic cross-sectional view illustrating a substrate fixing device according to a comparative example in a simplified manner.

FIG. 7 is a schematic cross-sectional view illustrating a substrate fixing device according to the comparative example in a simplified manner. With reference to FIG. 7, the substrate fixing device 1X differs from the substrate fixing device 1 (see FIG. 1 etc.) in that the electrostatic chuck 30 is replaced with an electrostatic chuck 30X.

The electrostatic chuck 30X has a base body 31, an electrostatic electrode 32, heating elements 33, and a wiring 36 as main constituent elements. Neither a current control element 34 nor a control circuit 35 is built in the electrostatic chuck 30X. A plurality of temperature-controllable regions 31e whose temperatures can be controlled independently are defined in the base body 31 in a plan view in a manner similar to or the same as that in FIG. 2. Further, one heating element 33 is disposed in each of the temperature-controllable regions 31e in a manner similar to or the same as that in FIG. 3. The heating elements 33 disposed in the temperature-controllable regions 31e respectively are insulated from one another. In this case, an amount of heat generated by each of the heating elements 33 can be changed independently by changing a value of a current flowing into the heating element 33.

One ends of the heating elements 33 are connected to one another through the wiring 36 and then connected to an input/output IN1 electric wire 65. The electric wire 65 is led out to the outside of the substrate fixing device 1X. The other ends of the heating elements 33 are connected to input/output IN2 electric wires 66 respectively. The electric wires 66 are led out to the outside of the substrate fixing device 1X. The total of the electric wire 65 and the electric wires 66 is the number of the heating elements 33+1. When, for example, there are one hundred heating elements 33, the total of the electric wire 65 and the electric wires 66 is one hundred and one.

For example, one of the electric wire 65 and each electric wire 66 is connected to the GND and the other of the electric wire 65 and the electric wire 66 is connected to a power supply. An amount of heat generated by each heating element 33 can be changed by a value of a voltage applied between the opposite ends of the heating element through the electric wire 65 and the electric wire 66. Alternatively, a constant voltage (pulsed voltage) may be supplied between the opposite ends of each heating element via the electric wire 65 and the electric wire 66. In this case, the amount of heat generated by the heating element 33 can be changed by changing a time during which the voltage is supplied to the heating element 33.

Since a relatively large current required for heat generation of the heating element 33 flows into the electric wire 65 and the electric wire 66, the diameter of each of through holes 10x of the base plate 10 in which the electric wire 65, 66 is disposed is, for example, 45 mm. Further, the diameter of the electric wire 65, 66 is, for example, 4 mm. Therefore, as the total number of the electric wire 65 and the electric wires 66 increases, an area occupied by the through holes 10x in the base plate 10 becomes so large that it cannot be ignored.

On the other hand, the plurality of heating elements 33, the current control elements 34 connected in series with the heating elements 33 respectively, and the control circuit 35 for controlling each of the current control elements 34 are built in the base body 31 of the electrostatic chuck 30 of the substrate fixing device 1. The control circuit 35 controls the current control element 34 in accordance with a control signal from the outside of the substrate fixing device 1. Due to a predetermined current that flows into a corresponding one of the heating elements 33 connected in series with the current control element 34 electrically conducted according to a command of the control circuit 35, the heating element 33 generates heat. With such a structure formed thus, three electric wires 61, 62, and 63 are used in the substrate fixing device 1.

For example, assume that the number of the temperature-controllable regions 31e is 100 in the case of the structure of the substrate fixing device 1X according to the comparative example shown in FIG. 7. In this case, the number of electrical connection lines between the substrate fixing device and the outside is 100 or more. That is, it is necessary to lead out the one hundred or more electric wires to the outside through the through holes 10x formed in the base plate 10. In this case, the area occupied by the through holes 10x in the base plate 10 becomes so large that it cannot be ignored, as described above, and the degree of freedom for designing the base plate 10 significantly decreases.

As described above, the three electric wires 61, 62 and 63 are used in the substrate fixing device 1. Therefore, the number of the through holes 10x formed in the base plate 10 of the substrate fixing device 1 is significantly reduced as compared with that in the substrate fixing device 1X. As a result, the area occupied by the through holes 10x in the base plate 10 is also significantly reduced. That is, the electrostatic chuck 30 of the substrate fixing device 1 can suppress a decrease in the degree of freedom for designing the base plate 10 even in a case where a large number of heating elements 33 are provided in the base body 31.

As described above, the three electric wires 61, 62 and 63 are used in the substrate fixing device 1. Therefore, cost can be reduced by reducing the number of components required for the connection of the substrate fixing device 1 to the outside. In addition, assembly difficulty can be greatly decreased due to a significant reduction in the number of soldering points, etc., so that an improvement in yield and reliability of the substrate fixing device 1 can be expected. Since the electrostatic chuck 30 is a consumable component, a cost reduction effect obtained by the improvement of the yield is large.

Further, due to a difference in coefficient of thermal expansion between the base plate and the base body 31, the base body 31 is generally displaced in a horizontal direction with respect to the base plate 10 depending on temperature conditions, and an amount of the displacement becomes larger toward an outer peripheral side of the base body 31. Therefore, if any through hole 10x is disposed on an outer peripheral side of the base plate 10, stress applied to the solder 50 connecting the electric wire and the wiring to each other lowers connection reliability of the solder 50, thereby resulting in disconnection in the worst case. In the substrate fixing device 1, the degree of freedom for arranging the through holes 10x formed in the base plate 10 is improved due to a reduction in the number of the through holes 10x for letting the electric wires therethrough. Therefore, the through holes 10x can be arranged on a central side of the base plate 10 while avoiding being arranged on the outer peripheral side of the base plate 10 where stress is easily applied to the solder 50. As a result, the connection reliability of the solder 50 is improved, so that the risk of the disconnection can be reduced.

(Modification 1 of First Embodiment)

A substrate fixing device 1A is shown by way of example in a modification 1 of the first embodiment. The substrate fixing device 1A is provided with an electrostatic chuck in which a plurality of control circuits are built in a base body. In addition, description about constituent elements having the same reference signs as those in the aforementioned embodiment may be omitted in the modification 1 of the first embodiment.

Figure 8:
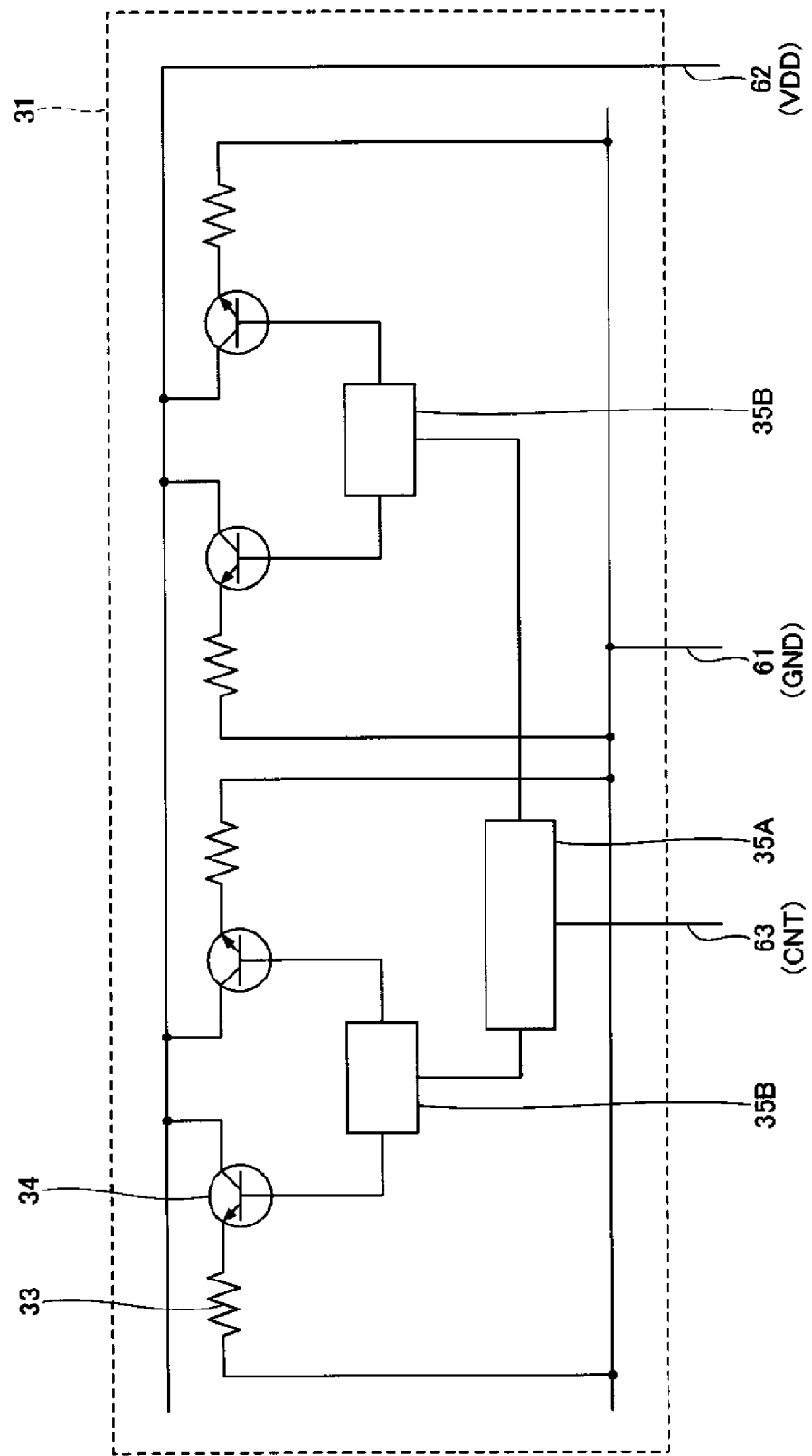
FIG. 8 is a diagram illustrating electrical connection among heating elements, current control elements, and control circuits in a substrate fixing device according to a modification 1 of the first embodiment.

FIG. 8 is a diagram illustrating electrical connection among heating elements, current control elements, and the control circuits in the substrate fixing device 1A according to the modification 1 of the first embodiment. As shown in FIG. 8, the plurality of control circuits are built in the base body 31 in the substrate fixing device 1A according to the modification 1 of the first embodiment. Specifically, a first control circuit 35A and two second control circuits 35B are built in the base body 31.

When a control signal is inputted from the outside of the substrate fixing device 1A to the first control circuit 35A, a command is transmitted from a predetermined control terminal of the first control circuit 35A to a predetermined one of the second control circuits 35B. Thus, a voltage is outputted from a predetermined control terminal of the second control circuit 35B to a third terminal (base) of a predetermined one of the current control elements 34, the current control element 34 is electrically conducted, and a current flows into a heating element 33 connected to the current control element 34.

For example, when there are one hundred heating elements 33 and one hundred current control elements 34, fifty current control elements 34 are connected to one of the two second control circuits 35B, and the remaining fifty current control elements 34 are connected to the other second control circuit 35B. When the number of second control circuits 35B is three or more, the number of current control elements 34 connected to each of the second control circuits 35B may be reduced.

Further, the control circuits may be connected in three or more stages. For example, a three-stage configuration in which the two second control circuits 35B are connected to the first control circuit 35A and a plurality of third control circuits are connected to each of the second control circuits 35B may be used.

Thus, the function of the control circuit 35 in the first embodiment may be divided by a plurality of control circuits (for example, the first control circuit 35A and the second control circuits 35B). As a result, since the number of pins per control circuit is reduced, the control circuit itself may be miniaturized so that an entire mounting area of the control circuit can be reduced.

When the control circuits are connected in two or more stages, it is preferable that the number of control circuits (first control circuits 35A in FIG. 8) in the first stage is one. In other words, it is preferable that the number of control circuits electrically connected to the outside is one. This is to reduce the number of electric wires 63 connected to the outside of the substrate fixing device 1A, and to consequently reduce the number of through holes for letting the electric wires 63 therethrough.

(Modification 2 of First Embodiment)

A substrate fixing device 1B is shown by way of example in a modification 2 of the first embodiment. The substrate fixing device 1B is provided with an electrostatic chuck in which another heating element generating heat due to a voltage applied thereto from the outside is built in a different layer from a layer of heating elements 33 in a base body 31. In the modification 2 of the first embodiment, description about constituent elements having the same reference signs as those in the aforementioned embodiment may be omitted.

FIG. 9 is a schematic cross-sectional view illustrating the substrate fixing device 1B according to the modification 2 of the first embodiment in a simplified manner. With reference to FIG. 9, the substrate fixing device 1B differs from the substrate fixing device 1 (see FIG. 1 etc.) in that the electrostatic chuck 30 is replaced with an electrostatic chuck 30B. Further, the electrostatic chuck 30B differs from the electrostatic chuck 30 (see FIG. 1 etc.) in that the heating element 40, an input/output IN1 electric wire 68, and an input/output IN2 electric wire 69 are added.

In the electrostatic chuck 30B, the heating element 40 that can be controlled independently of the heating elements 33 is disposed in the different layer from the layer of the heating elements 33. The heating element 40 can be, for example, disposed between an electrostatic electrode 32 and the heating elements 33 in a thickness direction. The heating element 40 which is, for example, a single resistor formed into a spiral pattern or the like is disposed so as to be able to heat an entire mounting face 31a of the base body 31 over a plurality of temperature-controllable regions 31e. The material of the heating element 40 is, for example, similar to or the same as that of the heating elements 33.

One end of the heating element 40 is connected to the electric wire 68, and the electric wire 68 is led out to the outside of the substrate fixing device 1B. The other end of the heating element 40 is connected to the electric wire 69, and the electric wire 69 is led out to the outside of the substrate fixing device 1B. Thus, there are one electric wire 68 and one electric wire 69.

For example, one of the electric wire 68 and the electric wire 69 is connected to the GND, and the other of the electric wire 68 and the electric wire 69 is connected to a power supply. An amount of heat generated by the heating element 40 can be changed by a value of a voltage applied between the opposite ends of the heating element 40 through the electric wire 68 and the electric wire 69. Alternatively, a constant voltage (pulsed voltage) may be supplied between the opposite ends of the heating element 40 through the electric wire 68 and the electric wire 69. In this case, the amount of heat generated by the heating element 40 can be changed by changing a time during which the voltage is applied to the heating element 40.

The heating element 40 may be built in the base body 31 separately from the heating elements 33. For example, a current can be made to flow into the heating element 40 to heat the mounting face 31a of the base body 31, and the heating elements 33 are then heated to compensatorily heat only a portion of the mounting face 31a that was not heated sufficiently. Thus, the entire mounting face 31a of the base body 31 can be heated uniformly.

In the above description, the heating element 40 is set as a single resistor. However, the heating element 40 may be set as a plurality of independent resistors to control temperatures of a plurality of regions independently.

Besides a semiconductor wafer (such as a silicon wafer), for example, a glass substrate or the like used in a process of manufacturing a liquid crystal panel or the like can be exemplified as the object adsorbed by the substrate fixing device according to the present disclosure.

Although the preferred embodiments etc. have been described in detail, the invention is not limited to the above-described embodiments etc. and various modifications and replacements can be made in the above-described embodiments etc. without departing from the scope of the claims.

What is claimed is:

1. An electrostatic chuck that is configured to adsorb and retain an object thereon, the electrostatic chuck comprising:
   a base body on which the object is mounted, the base body being an integral unitary body;
   an electrostatic electrode that is provided in the base body;
   a plurality of heating elements that are provided in the base body;
   a plurality of current control elements that are provided in the base body, and each of which is connected in series with a corresponding one of the heating elements; and
   a control circuit that is a semiconductor integrated circuit entirely built in the base body, and that is connected to the current control elements and configured to control operations of the current control elements.

2. The electrostatic chuck according to claim 1, wherein:
   a first heating element of the heating elements is connected in series with a first current control element of the current control elements; and
   the control circuit is configured to control operation of the first current control element so as to allow a current to flow into the first heating element connected in series with the first current control element.

3. The electrostatic chuck according to claim 1, wherein:
   the base body is divided into a plurality of regions;
   temperatures of the regions are controlled independently; and
   each of the heating elements is disposed in a corresponding one of the regions.

4. The electrostatic chuck according to claim 1, wherein:
   each of the current control elements is a transistor.

5. The electrostatic chuck according to claim 4, wherein:
   materials of the transistor include at least one of gallium nitride (GaN), gallium oxide ($Ga_2O_3$), or silicon carbide (SiC).

6. The electrostatic chuck according to claim 1, wherein:
   the control circuit comprises:
      a single first control circuit configured to receive a control signal from the outside of the electrostatic chuck, and
      at least one second control circuit that is connected to the first control circuit, and that is configured to control operations of at least some of the current control elements.

7. The electrostatic chuck according to claim 1, further comprising:
   another heating element that is provided in the base body, wherein a position of the other heating element is different from positions of the heating elements in a thickness direction of the electrostatic chuck.

8. A substrate fixing device comprising:
   a base plate that has a first through hole, a second through hole, and a third through hole; and
   an electrostatic chuck according to claim 1 that is mounted on one face of the base plate,
   wherein:
   a first electric wire that is electrically connected to the current control elements and a power supply is disposed in the first through hole;
   a second electric wire that is electrically connected to the heating elements and a ground is disposed in the second through hole; and a third electric wire that is configured to supply a control signal to the control circuit is disposed in the third through hole.

9. An electrostatic chuck that is configured to adsorb and retain an object thereon, the electrostatic chuck comprising:
   a base body on which the object is mounted, the base body being an integral unitary body;
   an electrostatic electrode that is provided in the base body;
   a plurality of heating elements that are provided in the base body;
   a plurality of current control elements that are provided in the base body, and each of which is connected in series with a corresponding one of the heating elements; and
   a control circuit that is a semiconductor integrated circuit provided in the base body, and that is connected to the current control elements and configured to control operations of the current control elements,
   wherein:
   the base body has a plurality of first recesses defined in an outer surface of the base body, and a second recess defined in the outer surface of the base body;
   at least one of the current control elements is housed in a corresponding one of the first recesses; and
   the control circuit is housed in the second recess.

* * * * *